(12) United States Patent
Chirovsky et al.

(10) Patent No.: US 6,169,756 B1
(45) Date of Patent: Jan. 2, 2001

(54) VERTICAL CAVITY SURFACE-EMITTING LASER WITH OPTICAL GUIDE AND CURRENT APERTURE

(75) Inventors: Leo Maria Chirovsky, Bridgewater; Lucian Arthur D'Asaro, Madison; William Scott Hobson, Summit; Sanghee Park Hui, New Providence, all of NJ (US); Ronald Eugene Leibenguth, Palmerton, PA (US); Betty Jyue Tseng, Berkeley Heights, NJ (US); James Dennis Wynn, Plainfield, NJ (US); George John Zydzik, Columbia, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 08/997,710

(22) Filed: Dec. 23, 1997

(51) Int. Cl.$^7$ ...................................... H01S 5/187

(52) U.S. Cl. .............................. 372/46; 372/45; 372/96; 372/98

(58) Field of Search ................................ 372/45, 46, 50, 372/92, 96, 108, 98, 101; 359/359

(56) References Cited

U.S. PATENT DOCUMENTS

| | | | |
|---|---|---|---|
| H137 | * 10/1986 | Briggs et al. ........................ | 75/398 |
| 4,819,039 | 4/1989 | Chi et al. .............................. | 257/650 |
| 4,949,350 | * 8/1990 | Jewell et al. ........................... | 372/45 |
| 5,206,871 | 4/1993 | Deppe et al. ......................... | 372/45 |
| 5,339,326 | * 8/1994 | Tsujimura et al. ..................... | 372/49 |
| 5,446,752 | * 8/1995 | Ackley et al. ......................... | 372/46 |
| 5,633,527 | * 5/1997 | Lear ...................................... | 257/432 |
| 5,754,578 | * 5/1998 | Jayaraman ............................ | 372/50 |
| 5,991,326 | * 11/1999 | Yuen et al. ............................ | 372/96 |

OTHER PUBLICATIONS

L.M.F. Chirovsky et al., "Implant–Apertured and Index–Guided Vertical–Cavity Surface–Emitting Lasers (IA2–VCSEL's)", IEEE Photonics Technology Letters, vol. 11 No. 5, pp. 500–502, May 1999.*

H. Deng and D.G. Deppe, "Oxide–Confined Vertical–Cavity Laser With Additional Etched Void Confinement", Electronics Letters, vol. 32, No. 10, pp. 900–901, May 1996.*

Y. H. Lee et al., "Top–Surface–emitting GaAs four–quantum–well lasers emitting at 0.85 $\mu$m" Electr. Lett., vol.26, No. 11, pp. 710–711, (May 1990).

J. M. Dallesasse et al., "Hydrolyzation oxidation of $Al_x Ga_{1-x}As$–AlAs–GaAs quantum well heterostructures and superlattices" Appl. Phys. Lett., vol. 57, No. 26, pp. 2844–2846 (Dec. 1990).

(List continued on next page.)

Primary Examiner—Rodney Bovernick
Assistant Examiner—Michael J. Stahl
(74) Attorney, Agent, or Firm—Michael J. Urbano

(57) ABSTRACT

A VCSEL comprises separate current and optical guides that provide unique forms of drive current and transverse mode confinement, respectively. In one embodiment, the optical guide comprises an intracavity high refractive index mesa disposed transverse to the cavity resonator axis and a multi-layered dielectric (i.e., non-epitaxial) mirror overlaying the mesa. In another embodiment, the current guide comprises an annular first electrode which laterally surrounds the mesa but has an inside diameter which is greater than that of an ion-implantation-defined current aperture. The current guide causes current to flow laterally from the first electrode along a first path segment which is essentially perpendicular to the resonator axis, then vertically from the first segment along a second path segment essentially parallel to that axis, and finally through the current aperture and the active region to a second electrode. The dielectric mirror is deposited only after the formation of the guides in order to facilitate their fabrication.

34 Claims, 1 Drawing Sheet

OTHER PUBLICATIONS

S.J. Pearton et al., "Implant isolation of device structures containing buried, highly–doped layers" Materials, Res. Soc. Symp. Proc., vol. 216, pp. 451–457 (1991). No month.

A. R. Sugg et al., "Native oxide–embedded $Al_yGa_{1-y}As$–GaAs–$In_xGa_{1-x}$ As quantum well heterostructure lasers" Appl. Phys. Lett., vol. 62, No. 11, pp. 1259–1261 (Mar. 1993).

D.L. Huffaker et al., "Native–oxide defined ring contact for low threshold vertical–cavity lasers" Appl. Phys. Lett., vol. 65, No. 1, pp. 97–99 (Jul. 1994).

K. D. Choquette et al., "Low threshold voltage vertical–cavity lasers fabricated by selective oxidation" Electr. Lett., vol.30, No 24, pp. 2043–2044 (Nov. 1994).

T. E. Sale, *Vertical Cavity Surface Emitting Lasers,* Research Studies Press Ltd., pp. 117–127 (1995). No month.

R. F. Nabiev et al., "Voltage drop in n–and p–type Bragg reflectors for vertical–cavity surface–emitting lasers" IEEE Phot. Tech. Lett., vol. 7, No. 7, pp. 733–735 (Jul. 1995).

M. H. MacDougal et al., "Electrically–pumped vertical–cavity lasers with $Al_xO_y$–GaAs reflectors" IEEE Phot. Tech. Lett., vol. 8, pp. 310–312 (Mar. 1996).

J. K. Guenter et al., "Reliability of proton–implanted VCSELs for data communications" Proc. SPIE, vol. 2683, pp. 102–113 (1996) No month.

K. D. Choquette et al., "Advances in selective wet oxidation of AlGaAs alloys" IEEE J. Selected Topics in Quantum Electronics, vol. 3, No. 3, pp. 916–925 (Jun. 1997).

M. B. Tayashi et al. "High power InGaAs/GaAs/InGaP surface emitting laser" Electr. Lett., vol. 33, No. 21, pp. 1794–1795 (Oct. 1997).

E. M. Levin et al., *Phase Diagrams for Chemists,* M. K. Editor, The American Ceramic Society, p. 430 (1964) No month.

* cited by examiner

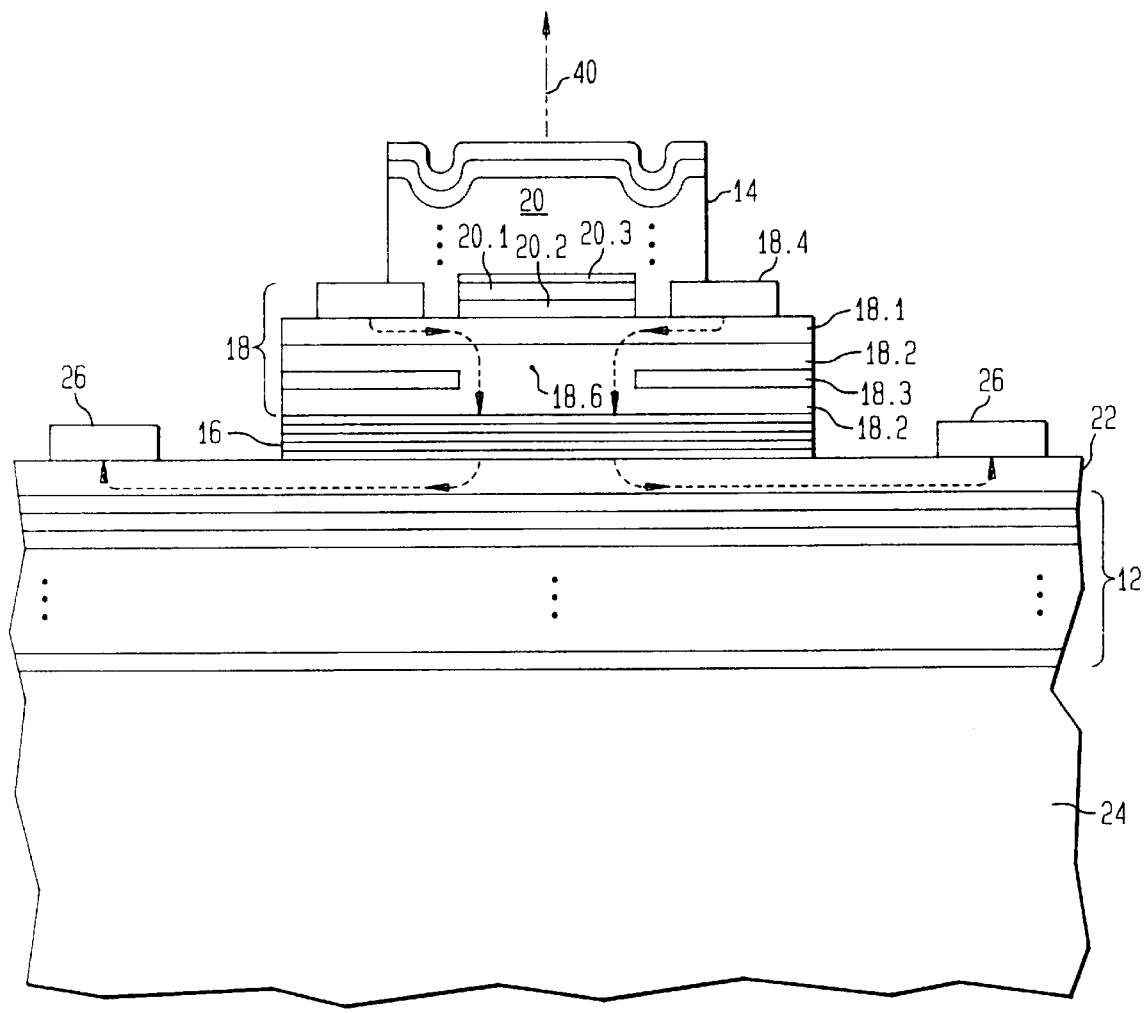

VERTICAL CAVITY SURFACE-EMITTING LASER WITH OPTICAL GUIDE AND CURRENT APERTURE

CROSS REFERENCE TO RELATED APPLICATIONS

This application was concurrently filed with application Ser. No. 08/997,711 entitled Optical Devices Having ZnS/Ca-Mg-Fluoride Multi-layered Mirrors and application Ser. No. 08/997,712 now U.S. Pat, No. 6,044,100 entitled Lateral Injection VCSEL (Hobson 10-17).

FIELD OF THE INVENTION

This invention relates generally to vertical cavity surface-emitting lasers (VCSELs) and, more particularly, to such lasers which provide for both drive current confinement and optical mode confinement.

BACKGROUND OF THE INVENTION

As compared with conventional edge-emitting semiconductor lasers, VCSELs hold the promise of a number of desirable characteristics. For example, the shorter cavity resonator of the VCSEL provides for better longitudinal mode selectivity, and hence narrower linewidths. The use of multi-layered DBR mirrors to form a cavity resonator perpendicular to the layers obviates the need for the cleaving operation common to edge emitting lasers. This orientation of the resonator also facilitates both the fabrication of laser arrays and wafer-level testing of the individual lasers.

The prior art has proposed two basic VCSEL designs: one defines a current confinement region in a p-doped semiconductor DBR mirror by means of an apertured, high resistivity ion implanted region (See, for example, Y. H. Lee et al., *Electr. Lett.,* Vol. 26, No. 11, pp. 710–711 (1990) and T. E. Sale, *Vertical Cavity Surface Emitting Lasers*, Research Press Ltd., pp. 117–127 (1995), both of which are incorporated herein by reference.), whereas the other defines the current confinement region by means of an apertured, high resistivity oxide layer (See, for example, D. L. Huffaker et al., *Appl Phys. Lett.,* Vol. 65, No. 1, pp. 97–99 (1994) and K. D. Choquette et al., *Electr. Lett.,* Vol. 30, No.24, pp. 2043–2044 (1994), both of which are incorporated herein by reference.). In the ion-implanted (I-I) approach, light ions (e.g., protons) are implanted to relatively deep depths (e.g., about 3 $\mu$m). However, due to ion straggle and other difficulties associated with deep implantation, this current guide must be relatively large (e.g., >10 $\mu$m). Both of these factors inhibit scaling the devices to smaller sizes. In addition, the I-I VCSEL does not form any significant optical guiding; i.e., it does not provide refractive index guiding of the transverse lasing modes, although there may be some gain guiding of the modes. As a result, these lasers typically have threshold currents >1 mA and operating currents >3 mA. Electrical power dissipation per laser is, therefore, at least several mW. In contrast, the oxide (OX) confinement approach has been shown to be scaleable to much smaller dimensions (e.g., the current aperture may be as small as 3 $\mu$m), which allows for an order of magnitude decrease in both the threshold and operating currents. In addition, the apertured oxide layer also forms a refractive index guide which leads to transverse mode confinement, resulting in at least another factor of two reduction in these currents. Thus, the power dissipation per device can be reduced by at least a factor of twenty ( to a fraction of a mW) compared to the I—I design. However, OX VCSELs have not yet proven to be as reliable as I-I VCSELs and may have a built-in stress problem. (See, FIG. 5 at p. 919 of K. D. Choquette et al., *IEEE Journal of Selected Topics in Quantum Electronics,* Vol. 3, No. 3, pp. 916–925 (June 1997), which is incorporated herein by reference.) Moreover, the oxidation process is not very reproducible and hence is not conducive to high yields (Ibid at pp. 921, 924). More specifically, this process entails oxidizing a high Al-content Group III-V layer after it has been covered by other layers; i.e., the outer edges of the high Al-content layer are exposed to water vapor so that oxidation progresses inwardly (i.e., laterally) over a relatively long distance (e.g., 10s of $\mu$m ) toward the center and yet must be precisely stopped so as to leave a very small diameter (e.g., 3 $\mu$m) current guide unoxidized. This process entails controlling oxidation time, assuming knowledge of the oxidation rate. However, this rate depends on many factors, including parameters of the process and properties of the materials to be oxidized. Controlling all of these factors is very difficult.

Thus, a need remains in the art for a VCSEL design that provides for both current and optical confinement and yet is scaleable, reproducible and amenable to array applications.

SUMMARY OF THE INVENTION

In accordance with one aspect of our invention, a VCSEL comprises separate current and optical guides that provide unique forms of drive current and transverse mode confinement, respectively. In one embodiment, the optical guide comprises an intracavity, high refractive index mesa disposed transverse to the cavity resonator axis and a multi-layered dielectric (i.e., non-epitaxial) mirror overlaying the mesa. In another embodiment, the current guide comprises an annular first electrode which laterally surrounds the mesa but has an inside diameter which is greater than that of an ion-implantation-defined current aperture. The current guide causes current to flow laterally from the first electrode along a first path segment which is essentially perpendicular to the resonator axis, then vertically from the first segment along a second path segment essentially parallel to that axis, and finally through the current aperture and the active region to a second electrode.

In accordance with another aspect of our invention, a method of fabricating a VCSEL comprises the steps of forming a first multi-layered mirror, forming a current return layer, forming an active region, forming a current guide for causing current to flow through a current aperture to the active region, forming an optical guide in the form of a high refractive index mesa, forming a first electrode which laterally surrounds the mesa, forming a second electrode to the current return layer, and forming a second multi-layered mirror so as to at least partially embed the mesa therein. The fabrication of these guides is facilitated by the use of a dielectric (i.e., non-epitaxial) second mirror which is deposited after the guides are made.

In one embodiment of the inventive method, the first mirror is formed by epitaxial growth of semiconductor layers, and the second mirror is formed by e-beam deposition of dielectric layers. In another embodiment, both mirrors are deposited dielectric layers.

BRIEF DESCRIPTION OF THE DRAWINGS

Our invention, together with its various features and advantages, can be readily understood from the following more detailed description taken in conjunction with the accompanying drawing, in which the sole FIGURE is a schematic, cross-sectional view of a VCSEL in accordance with one embodiment of our invention. In the interest of clarity and simplicity the FIGURE has not been drawn to scale. In this regard, the VCSEL is actually much more nearly planar than it appears in the figure and as such is suitable for flip-chip bonding to, for example, another chip or a circuit board. In addition, when describing physical or optical dimensions, the symbol A stands for Angstroms, whereas when describing electric current, it stands for Amperes.

DETAILED DESCRIPTION OF THE INVENTION

With reference now to the FIGURE, a VCSEL in accordance with one aspect of our invention comprises first and second multi-layered mirrors 12 and 14, respectively, forming an optical cavity resonator with its axis perpendicular to the layers. An active region 16 and an optical guide 20 are disposed within the resonator and are oriented perpendicular to its axis. When suitably pumped, the active region generates stimulated emission of radiation (at a center wavelength $\lambda$) which propagates along the resonator axis and emerges from the resonator through one of the mirrors (e.g., second mirror 14) as an output signal 40. In accordance with one feature of our invention, the optical guide 20, in the form of a relatively high refractive index mesa, serves to confine the transverse modes of the lasing radiation; i.e., viewed another way, it defines the beam waist of the radiation. In accordance with another feature of our invention the active region is pumped by means of a current guide 18 which includes a current confinement aperture 18.6.

The current guide 18 comprises a relatively high conductivity, contact-facilitating layer 18.1, an annular first electrode 18.4 formed on layer 18.1, a lower conductivity layer 18.2 beneath layer 18.1, and a high resistivity, ion-implanted region or zone 18.3 formed in the layer 18.2. Region 18.3 typically has an annular shape, the central opening of which forms the current confinement aperture 18.6. With the inside diameter of the first electrode 18.4 being greater than the diameter of the aperture 18.6, an overall effect of the guide 18 is that current from first electrode 18.4 first flows essentially horizontally (i.e., perpendicular to the resonator axis) along a first path segment through layer 18.1. The ion-implanted region then causes the current to change directions and to flow essentially vertically (i.e., parallel to the resonator axis) along a second path segment through the upper portion of layer 18.2 to the aperture 18.6. At this point the current continues to flow essentially vertically through the active region 16, and completes its path to second annular electrode 26 via a high conductivity, current return layer 22 disposed between the active region 16 and the first mirror 12.

In order to accurately control implant depth, the region 18.3 is preferably implanted with relatively heavy ions (e.g. oxygen, fluorine) to a relatively shallow depth (e.g., 0.1–0.2 $\mu$m) below the top of high conductivity layer 18.1. After ion-implantation, the structure is suitably annealed in order to remove shallow traps in layers 18.1 and 18.2, and yet retain deep traps which produce high resistivity in region 18.3. (See, S. J. Pearton et al. *Materials Research Society Symposium Proceedings,* Vol. 216, pp. 451–457 (1991), which is incorporated herein by reference.)

In addition, in order to facilitate the formation of the first electrode 18.4 on the high conductivity layer 18.1, which is typically relatively thin (e.g., a few 100 A), the layer 18.1 may be replaced by a composite of three sub-layers (not shown); namely, a relatively low conductivity layer sandwiched between a pair of higher conductivity layers, with the bottom sub-layer being located relatively far below (e.g., 1500 A) the top of the upper sub-layer where the electrode would be formed. The layer 18.3 then would be 2000–3000 A below the top of layer 18.1. The thickness and placement of the three layers are determined by the resonant cavity standing wave pattern; i.e., each high conductivity layer, typically a few 100 A thick, straddles a node (to reduce free-carrier absorption), and the thickness of the low conductivity layer is chosen so that the nodes are $N\lambda/2n$ apart, where N is positive integer and n is the effective refractive index of the active region.

The mirrors are illustratively multi-layered DBR reflectors comprising alternating sets of layers of different refractive index. As depicted, mirror 12 comprises alternating epitaxial layers of Group III-V compound semiconductor material, each layer being about $\lambda/4n_s$ thick, where $n_s$ is the refractive index of the corresponding layer of semiconductor mirror 12. Typically one set comprises layers of $Al_xG_{1-x}As$ and the other set comprises layers of $Al_yGa_{1-y}As$, where x and y are different from one another. In contrast, mirror 14 comprises alternating layers of dielectric (i.e., non-epitaxial) material, each layer being about $\lambda/4n_D$ thick, where $n_D$ is the refractive index of the corresponding layer of dielectric mirror 14. Typically, one set comprises layers of a $MgF_2$-$CaF_2$ composite, whereas the other set comprises layers of ZnS. Composites with approximately a 95% $MgF_2$ and 5% $CaF_2$ by mole fraction in the layer are preferred from the standpoint of layer adhesion (to one another) and optical scattering. Fluoride layers with this composition are preferably fabricated by e-beam deposition from a eutectic melt comprising approximately 47% $MgF_2$ and 53% $CaF_2$ by weight or, equivalently, approximately 53% $MgF_2$ and 47% $CaF_2$ by mole fraction.

Alternatively, if the substrate 24 were removed after the other sections of the laser have been fabricated, then the mirror 12 could also comprise dielectric layers of the type described with reference to mirror 14. In this case, an output signal could emanate from both mirrors. Or, one or more pairs of one of the dielectric mirrors could be replaced with a high reflectivity metal (e.g., Au or Ag) coating, thus forcing the output signal to emanate only from the other mirror. The metal coating may also serve to reduce the topological profile of the device. The term substrate as used herein means any support member on which other layers of the laser are formed. For example, it might be a single crystal body on which epitaxial layers are grown, or it might be a combination of such a substrate and an epitaxial buffer layer.

The optical guide 20 is at least partially embedded in the mirror 14; i.e., the mirror 14 overlays and directly contacts the guide 20. Thus, the diameter of the mirror 14 is larger than that of the guide 20, thereby serving to reflect at least a portion of any radiation which is outside the beam waist defined by the guide 20, and may be larger than the inside diameter of the electrode 18.4, as shown. Illustratively, guide 20 comprises a mesa formed by a relatively high refractive index layer 20.1 (e.g., GaAs), and may also include an underlying stop-etch layer 20.2 (e.g., an InGaP layer) and an overlying protective layer 20.3 (e.g., a glass layer). The cross-sectional shape of the mesa may be rectangular, as shown, or may be curved (e.g., convex with the mesa being thicker in the center and tapering to thinner at its edges). Preferably, one of the lower refractive index layers of the mirror 14 is located immediately adjacent the high refractive index layer 20.1 (or the protective layer 20.3, if used) of the mesa, and the refractive index of layer 20.1 should be greater than that of the immediately adjacent layer of the mirror.

The stop-etch layer 20.2 allows for controlled etching to expose the portions of contact-facilitating layer 18.1 on which electrode I 8.4 is formed. On the other hand, protective layer 20.3 ensures that the top surface of high index layer 20.1 remains optically smooth during various processing steps, and that the $N\lambda/2n$ thickness discussed herein is preserved. To these ends, the protective layer 20.3 should be resistant to any chemicals used in subsequent processing steps (e.g., a developer used in a lift-off process or a chemical used in a cleaning step). In addition, it should have a refractive index similar to that of the adjacent low refractive index layer of mirror 14. Thin layers of glass, such as aluminum borosilicate glass (n=1.47) about 50–150 A thick, are particularly suitable for this purpose. The latter glass may be e-beam deposited from source material (e.g., about 1% $Al_2O_3$, 3% $B_2O_3$ and 96% $SiO_2$ by weight) commercially available from Corning Glassworks, Inc., Corning, N.Y. under the trademark VYCOR.

The active region 16 is disposed between the current guide 18 and the current return layer 22. The active region may be a single layer, but is preferably a well-known multi-quantum well (MQW) region comprising alternating layers of different bandgap; e.g., GaAs quantum well layers interleaved with AlGaAs barrier layers for operation at a center wavelength of about 0.85 $\mu$m. On the other hand, the layer 22 typically comprises n-type GaAs. Likewise, the semiconductor layers of current guide 18 may comprise GaAs, but layer 18.1 is $p^{++}$- type and layer 18.2 is p-type (also known as $\pi$-type). Preferably, the total thickness of layer 22, active region 16, layers 18.1 and 18.2, and the optical guide 20 together should be $N\lambda/2n$, as described above except that N>1. In order to reduce free-carrier absorption, the high conductivity layer 18.1 is preferably located essentially at a node of the standing wave of the lasing radiation in the cavity resonator. On the other hand, in order to increase the interaction between the optical field of the radiation and the injected minority carriers the active region is preferably located essentially at an anti-node of the standing wave.

For operation at other center wavelengths the MQW active region would be made of different semiconductor materials such as InP and InGaAsP (e.g., for operation at 1.3 $\mu$m or 1.5 $\mu$m), and the mirrors would have to be made of well-known materials that provide suitable reflectivity at those wavelengths. Similarly, for operation at 0.98 $\mu$m the MQW active region could be made of InGaAs and GaAs, or of InGaAs and GaAsP.

Electrodes 26 and 18.4 on the VCSEL are preferably annular contacts located on the same side of the laser, as shown, to facilitate applications such as flip-chip bonding of the laser to another chip or a circuit board. However, for other applications the contact 26 could instead be a broad area contact located on the bottom of substrate 24, if the mirror 12 and the substrate 24 are suitably doped to provide a low resistance path therethrough.

In accordance with another aspect of our invention, a VCSEL of the type described above is fabricated by a sequence of process steps which produces lateral structural features that can be scaled reproducibly to smaller sizes than those of prior art VCSEL,s and which enables the optical guide 20 to be formed before the mirror 14 is formed. Illustratively, the general process sequence includes the steps of providing a single crystal substrate 24, forming the mirror 12 on the substrate 24, forming the current return layer 22, forming the MQW active region 16, forming the current guide 18 on the active region, forming the optical guide 20 on the current guide 18, forming electrodes 26 and 18.4 to the laser, and forming mirror 14 on top of the optical guide 20. In one embodiment of the inventive method, the mirror 12 is epitaxially grown, and the mirror 14 is e-beam deposited. In another embodiment, both mirrors are e-beam deposited. In still another embodiment the mirror 14 is made to overlap the annular electrode 18.4.

Although a number of epitaxial growth techniques may be used to form the various semiconductor layers of the VCSEL, molecular beam epitaxy (MBE) and metalorganic chemical vapor deposition (MOCVD) are both well suited to the thickness control required for many of the extremely thin layers; e.g. the layers of mirror 12 and MQW active region 16. On the other hand, the dielectric (non-epitaxial) layers of mirror 14 are typically formed by e-beam deposition from single crystal sources under conditions which avoid crystalline diversification. See, for example, U.S. Pat. No. 5,206,871, granted to D. G. Deppe et al. on Apr. 27, 1993, which is incorporated herein by reference. Other techniques, such as sputtering or plasma deposition, may also be suitable.

A masking process can be used to define the current aperture 18.6 and the guide 20 as a self-aligned structure. That is, the same photoresist mask used to shield the aperture 18.6 from ion-implantation can also be used to etch the shape of the mesa, with the underlying stop-etch layer 20.2 facilitating the etching of the overlying high index layer 20.1. However, in some cases it may be advantageous to form the aperture 18.6 and the guide 20 with different diameters (i.e., a structure that is not self aligned).

On the other hand, a different masking process is employed to pattern the dielectric mirror 14. More specifically, a layer of photoresist (PR) is deposited on top of the wafer after the contacts have been formed. The thickness of the PR should be greater than the intended height of the mirror 14. A re-entrant opening is formed in the PR. Illustratively, the re-entrant opening has a trapezoidal cross-section with the top of the trapezoid corresponding to the top of the opening. The dielectric mirror is then deposited in the opening and on top of the PR. Lastly, the PR is lifted off by suitable etching, leaving the desired dielectric mirror on the top of the VCSEL.

EXAMPLE

The following example describes the fabrication of a VCSEL of the type depicted in the figure. Although the fabrication of a single device is described, it will be understood, of course, that typically an array of devices is formed on a single wafer. The various material, dimensions, and other parameters are provided by way of illustration only and, unless otherwise expressly indicated, are not intended to limit the scope of the invention. MBE and MOCVD were used to grow all of the semiconductor layers. The term undoped epitaxial layer as used herein generally means that the layer was not intentionally doped, but may have been subject to low level doping from background dopants in the growth chamber.

The VCSEL was designed for operation at a free-space center wavelength of about 0.98 $\mu$m, a threshold current of about 1 mA, an operating current of about 3–5 mA, and a power dissipation of about 5–10 mW. To this end the laser comprised: an $n^+$-doped single crystal GaAs substrate obtained from commercial sources; a DBR mirror 12 comprising 28 pairs of $n^+$-doped GaAs/AlAs layers each doped with Si to about $3\times10^{18} cm^{-3}$ and about 696A/829 A thick, respectively; an n-type GaAs current-return layer 22 doped with Si to about $1\times10^{18}$ $cm^{-3}$, an MQW active region 16 comprising 3 pairs of undoped $In_{0.2}Ga_{0.8}As/GaAs$ layers, each layer being about 80 A thick; a π-type GaAs layer 18.2 about 3000 A thick and doped with Be to about $5\times10^{17}$ cm$^{-3}$; a region 18.3 implanted with fluorine ions (at 100 keV and a dose of $4\times10^{12}$ cm$^{-2}$) to a depth of about 0.1–0.2 $\mu$m below the top of layer 18.1 and forming a circular current aperture 18.6 either about 6 $\mu$m in diameter or about 10 $\mu$m in diameter; a p$^{++}$-type GaAs layer 18.1 about 300 A thick and doped with C to about $10^{20}$ cm$^{-3}$; an undoped In$_{0.5}$Ga$_{0.5}$P layer 20.2 about 200 A thick; an undoped GaAs layer 20.1 about 300 A thick; and an aluminum borosilicate glass protective layer 20.3 about 80 A thick.

In order to remove shallow traps in layers 18.1 and 18.2, the structure was annealed at about 500° C. for about 20 min.

The two electrodes, both in the form of an annulus, were deposited by conventional ebeam evaporation techniques to form the electrode 18.4 as a p-type ohmic contact and the electrode 26 as an n-type ohmic contact.

After the electrodes were deposited, an aluminum borosilicate glass protective layer 20.3 was deposited on the semiconductor surface on which dielectric mirror 14 was to be subsequently formed in order to protect the surface from attack by the PR developer described below. The protective layer 20.3, which was about 80 A thick and had a refractive index of about 1.47, was e-beam deposited from a source comprising approximately 1% Al$_2$O$_3$, 3% B$_2$O$_3$ and 96% SiO$_2$. Then, the dielectric mirror 14 was deposited by e-beam evaporation and patterned by a lift-off technique as follows.

A negative tone PR (i.e., NR8-3000 PR obtained from Futurrex Inc., Franklin, N.J.) was spun on at 3000 rpm on the top of the wafer. The PR was then soft baked at 130° C. for 1 min. on a hot plate. Light at a wavelength of 385 nm and an energy of 150 mJ was directed at the PR through a suitable shadow mask. As with standard photolithography, only the region where an opening was to be formed (and a mirror was to be deposited) was so exposed. Then the PR was soaked for 10 min. in an aqueous alkaline RD2 developer. As a result, a re-entrant, trapezoidal opening about 6 $\mu$m wide at the top (10 $\mu$m wide in other cases) with about 1 $\mu$m of undercut was formed in the PR. The opening was cleaned in an oxygen plasma for 2 min. at 250 mTorr and 50 W. Then, the dielectric mirror 14 was deposited as described below.

The mirror 14 comprised 6 pairs of layers, each pair including a MgF$_2$—CaF$_2$ layer having a refractive index of 1.38 and a thickness of about 1775 A and a ZnS layer having a refractive index of 2.30 and a thickness of about 1065 A. To avoid crystalline diversification the former layers were e-beam deposited in a vacuum chamber at a pressure of $1\times10^{-6}$ to $5\times10^{-6}$ Torr and at a substrate temperature of 50–80° C. Deposition took place from single crystal eutectic source (i.e., melt) of about 47% MgF$_2$ and 53% CaF$_2$ by weight or, equivalently, 53% MgF$_2$ and 47% CaF$_2$ by mole fraction. To remove water from all surfaces of the chamber and the substrate, the substrate was heated to above 100° C. (e.g., 108° C.) for about 15 min. before being lowered to the deposition temperature (e.g., 62° C.).

After the mirror was deposited, lift-off of the PR was performed by soaking in boiling acetone for 2 min. Residual flakes of PR were removed with an acetone spray.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In particular, both mirrors 12 and 14 may be made of dielectric layers. In this design, all of the semiconductor layers (e.g., current return layer 22, active region 16, current guide layers 18.1 and 18.2, and optical aperture 20) would first be grown on the substrate, the guides would be formed, the contacts would be made, and mirror 14 would be deposited as described above. Then, the substrate would be removed (e.g., by a suitable etching technique), and mirror 12 would be deposited on the exposed layer 22, again using the process described above. Instead of removing the entire substrate, an opening may be formed therein exposing a portion of the current return layer 22. The mirror 12 would then be deposited in the opening.

In addition, the well known technique of delta-doping may be utilized to dope any of the semiconductor layers, especially those which have high levels of carrier concentration (e.g., layers 18.1 and 22). Moreover, the conductivity types of the various layers could be reversed; e.g., the current guide 18 could be n-type instead of p-type and the current return layer 22 could be p-type instead of n-type.

What is claimed is:

1. A VCSEL comprising
   a pair of multi-layered mirrors forming a cavity resonator having a resonator axis perpendicular to said layers,
   an active region disposed within said resonator,
   current guide means for directing current through a current aperture to said active region to generate stimulated emission of radiation which propagates along said axis, a portion of said radiation forming an output signal which emerges from said resonator, characterized in that
   said laser includes an optical guide in the form of a relatively high refractive index, intracavity mesa disposed transverse to said axis and axially localized between one of said mirrors and said active region, said optical mesa being effective to define the beam waist of said radiation and interfacing with the remainder of said resonator in a low reflectivity manner, all interfaces with said mesa being free of voids.

2. The invention of claim 1 wherein said mesa is at least partially embedded in said one mirror and the refractive index of said mesa is greater than that of the portion of said one mirror immediately adjacent said mesa.

3. The invention of claim 2 wherein the diameter of said one mirror is larger than the diameter of said mesa.

4. The invention of claim 1 wherein the cross-section of said mesa is essentially rectangular.

5. The invention of claim 1 wherein the cross-section of said mesa is curved.

6. The invention of claim 1 wherein said mesa is aligned with said current aperture.

7. The invention of claim 1 wherein said current guide means includes an ion-implanted zone with an opening therein forming said current aperture.

8. The invention of claim 7 wherein said current guide means further includes an annular first electrode laterally surrounding said mesa and having an inside diameter greater than the diameter of said current aperture.

9. The invention of claim 8 wherein said one mirror overlaps said first electrode.

10. The invention of claim 8 wherein said current guide means includes a multi-layer stack disposed between said first electrode and said current aperture, said stack comprising a relatively high conductivity first layer and a lower conductivity second layer, said ion-implanted zone being disposed in said second layer.

11. The invention of claim 10 wherein said ion-implanted zone is located approximately 0.1–0.2 µm below the top of said first layer.

12. The invention of claim 10 wherein said first layer is located at essentially a node of the standing wave of said radiation in said resonator.

13. The invention of claim 10 wherein said first layer comprises at least three sub-layers including a pair of relatively high conductivity sub-layers and a lower conductivity sub-layer disposed therebetween.

14. The invention of claim 1 wherein said active region comprises a MQW structure of InGaAs and GaAs layers, said mesa comprises an InGaP layer and a GaAs layer, said GaAs layer being disposed between said InGaP layer and said one mirror.

15. The invention of claim 1 wherein said one mirror comprises interleaved sets of dielectric layers of different refractive index.

16. The invention of claim 15 wherein each of said dielectric layers in one set comprises a composite of about 95% $MgF_2$ and 5% $CaF_2$ by mole fraction, and each of said dielectric layers in the other set comprises ZnS.

17. The invention of claim 8 further including a second electrode located on the same side of said laser as said first electrode.

18. The invention of claim 1 further including an intracavity glass protective layer disposed on top of said mesa.

19. The invention of claim 18 wherein said protective layer comprises an aluminum borosilicate glass layer.

20. A VCSEL comprising
   a first DBR mirror comprising interleaved sets of GaAs and AlAs layers of different refractive index and a second DBR mirror comprising interleaved sets of dielectric layers of different refractive index, said mirrors forming a cavity resonator having a resonator axis perpendicular to said layers,
   a MQW active region disposed within said resonator,
   current guide means for directing current through a current aperture to said active region to generate stimulated emission of radiation which propagates along said axis, a portion of said radiation forming an output signal which emerges through said second mirror, said current guide means including a first annular electrode disposed adjacent said second mirror and having an inside diameter larger than that of said current aperture, and means for controlling the flow of current from said first electrode along a first path segment which is essentially perpendicular to said axis and from said first segment along a second path segment essentially parallel to said axis and then through said current aperture to said active region, said controlling means including a multi-layer stack disposed between said first electrode and said current aperture, said stack comprising a relatively high conductivity first layer located at essentially a node of the standing wave of said radiation in said resonator, a lower conductivity second layer adjacent said first layer, and an ion-implanted zone disposed in said second layer at a distance of about 0.1–0.2 µm below the top of said first layer and having an opening forming said current aperture, and
   an optical guide in the form of a relatively high refractive index, intracavity mesa disposed transverse to said axis and aligned with said current aperture, said mesa being at least partially embedded in said second mirror and comprising a GaAs layer, an intracavity protective glass layer overlying said GaAs layer and disposed adjacent said mirror, and an InGaP layer underlying said GaAs layer, the diameter of said first mirror being larger than the diameter of said mesa, said mesa being axially localized between said active region and said second mirror and being effective to define the beam waist of said radiation and interfacing with the remainder of said resonator in a low reflectivity manner, all interfaces with said mesa being free of voids.

21. The invention of claim 20 wherein each of said dielectric layers in one set comprises a composite of about 95% $MgF_2$ and 5% $CaF_2$ by mole fraction and each of said dielectric layers in the other set comprises ZnS.

22. The invention of claim 20 wherein said high conductivity first layer comprises at least three sub-layers including a pair of relatively high conductivity sub-layers and a lower conductivity sub-layer disposed therebetween.

23. The invention of claim 20 wherein said protective layer comprises an aluminum borosilicate glass layer.

24. A method of fabricating a VCSEL comprising the steps of
   a) forming a first mirror comprising interleaved sets of semiconductor layers of different refractive index,
   b) forming a current return layer on the first mirror,
   c) forming a MQW active region on the current return layer,
   d) forming a current guide for causing current to flow through a current aperture to said active region,
   e) forming an optical guide in the form of a relatively high refractive index, intracavity mesa,
   f) forming a first electrode having an opening surrounding said mesa, and forming a second electrode on the current return layer, and
   g) forming a second mirror on top of said mesa, said second mirror comprising interleaved sets of dielectric layers of different refractive index, said mirrors forming a cavity resonator for radiation generated by said active region and having its axis perpendicular to said layers, said mesa being formed so as to be axially localized between said active region and said second mirror and being effective to define the beam waist of said radiation,
   h) forming said mesa so that it interfaces with the remainder of said resonator in a low reflectivity manner and so that no voids are formed adjacent thereto.

25. The invention of claim 24 wherein step (d) includes
   d1) forming a relatively low conductivity first layer,
   d2) implanting ions into said first layer so as to form said current aperture, and
   d3) forming a higher conductivity second layer on said first layer, and wherein in step (e) said mesa is formed on said second layer.

26. The invention of claim 24 wherein in step (g) said second mirror partially embeds said mesa therein, and the refractive index of the portion of said mesa immediately adjacent said mirror is greater than the refractive index of the portion of said mirror immediately adjacent said mesa portion.

27. The invention of claim 26 wherein in step (e) said mesa is formed of a first optically smooth sub-layer corresponding to said mesa portion, a second sub-layer underlying said first sub-layer and serving as a stop-etch in the shaping of said mesa, and a third intracavity glass sub-layer overlying said first sub-layer and serving to protect the optical smoothness thereof.

28. The invention of claim 27 wherein step (e) includes forming said glass layer by e-beam evaporation from a source comprising $Al_2O_3$, $B_2O_3$ and $SiO_2$.

29. The invention of claim 24 wherein step (g) includes depositing said second mirror as a DBR mirror comprising interleaved sets of dielectric layers of different refractive index.

30. The invention of claim 29 wherein in one set each of said dielectric layers comprises a composite of about 95% $MgF_2$ and 5% $CaF_2$ by mole fraction and in the other set each of said dielectric layers comprises ZnS.

31. The invention of claim 25 wherein in step (d2) said ions are implanted to a depth of about 0.1–0.2 $\mu$m below the top of said second layer.

32. The invention of claim 25 wherein said higher conductivity second layer comprises at least three sub-layers including a pair of relatively high conductivity sub-layers and a lower conductivity sub-layer disposed therebetween.

33. A method of fabricating a VCSEL comprising the steps of
 a) providing a substrate,
 b) forming a relatively high conductivity layer on said substrate,
 c) forming an active region on said high conductivity layer, said active region being effective to generate radiation,
 d) forming a current guide for causing current to flow through a current aperture to said active region,
 e) forming an optical guide in the form of a relatively high refractive index, intracavity mesa,
 f) forming a first annular electrode which laterally surrounds said mesa, and
 g) forming a mirror on top of said mesa, said mirror comprising interleaved sets of dielectric layers of different refractive index, said mesa being formed so as to be axially localized between said active region and said second mirror and being effective to define the beam waist of said radiation,
 h) forming said mesa so that it interfaces with the remainder of said resonator in a low reflectivity manner and so that no voids are formed adjacent thereto.

34. The invention of claim 33 further including the steps of
 h) removing said substrate, thereby exposing said high conductivity layer and
 i) forming another mirror on said high conductivity layer, said mirror comprising interleaved sets of dielectric layers of different refractive index, said mirrors forming a cavity resonator having its axis perpendicular to said layers.

* * * * *